United States Patent [19]

Bessolo et al.

[11] Patent Number: 4,825,409
[45] Date of Patent: Apr. 25, 1989

[54] NMOS DATA STORAGE CELL FOR CLOCKED SHIFT REGISTER APPLICATIONS

[75] Inventors: Jeffrey M. Bessolo, Groton; Michael A. Wolf, Northboro, both of Mass.

[73] Assignee: Wang Laboratories, Inc., Lowell, Mass.

[21] Appl. No.: 733,159

[22] Filed: May 13, 1985

[51] Int. Cl.⁴ .................. G11C 7/00; G11C 11/34; G11C 11/40

[52] U.S. Cl. .................... 365/154; 365/189; 365/203; 365/233; 365/73; 307/272.1

[58] Field of Search ............... 365/189, 190, 203, 154, 365/233, 78, 73; 377/105; 307/279, 481, 291, 272 R

[56] References Cited

U.S. PATENT DOCUMENTS

| | | | |
|---|---|---|---|
| 3,389,383 | 6/1968 | Burke et al. | 365/154 |
| 3,662,356 | 5/1972 | Michon et al. | 365/154 |
| 3,831,155 | 8/1974 | Tamaru et al. | 365/182 X |
| 4,062,000 | 12/1977 | Donnelly | 365/203 |
| 4,112,296 | 9/1978 | Heimbigner et al. | 307/291 X |
| 4,380,055 | 4/1983 | Larson | 365/154 |
| 4,409,680 | 10/1983 | Schnathorst et al. | 365/190 X |
| 4,458,337 | 7/1984 | Takemae et al. | 365/233 |
| 4,499,559 | 2/1985 | Kurafuji | 365/190 |
| 4,542,484 | 9/1985 | Ikeda | 365/154 X |
| 4,558,434 | 12/1985 | Baba et al. | 365/190 X |
| 4,559,619 | 12/1985 | Ikeda | 365/190 |
| 4,598,214 | 7/1986 | Sexton | 307/291 |
| 4,607,350 | 8/1986 | Scianna | 365/154 |
| 4,651,333 | 3/1987 | Cappon | 307/481 X |
| 4,654,826 | 3/1987 | Yamanouchi et al. | 365/154 X |

Primary Examiner—Stuart N. Hecker
Assistant Examiner—Alyssa H. Bowler
Attorney, Agent, or Firm—Michael H. Shanahan; Scott K. Peterson

[57] ABSTRACT

An improved NMOS storage cell for use in shift registers is disclosed. Among other components, it contains a pair of inverters—one them an enabling inverter. A pre-charge transistor is placed in parallel with the first inverter to decrease the rise time associated with the transition from a logic low level output to a logic high level output. The result of adding the pre-charge transistor to the circuit is to increase the speed of operation of the storage cell, without the accompanying decrease in density with prior art methods, where the components must be enlarged. Another aspect of the present invention which further increases the density of the cell is the elimination of the complement clock line found in many prior art storage cells. The previous combination of a second inverter and a pass transistor connected to a complement clock line, is replaced by an enabling inverter connected to the clock line.

10 Claims, 1 Drawing Sheet

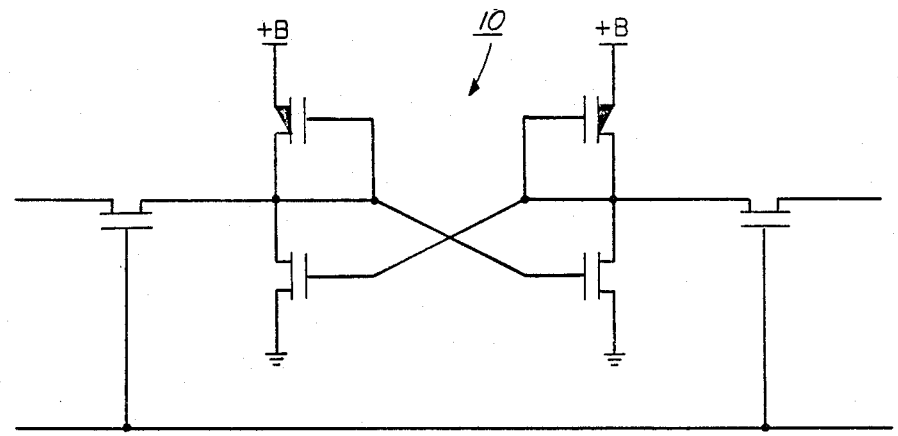
FIG. 1 PRIOR ART RAM CELL
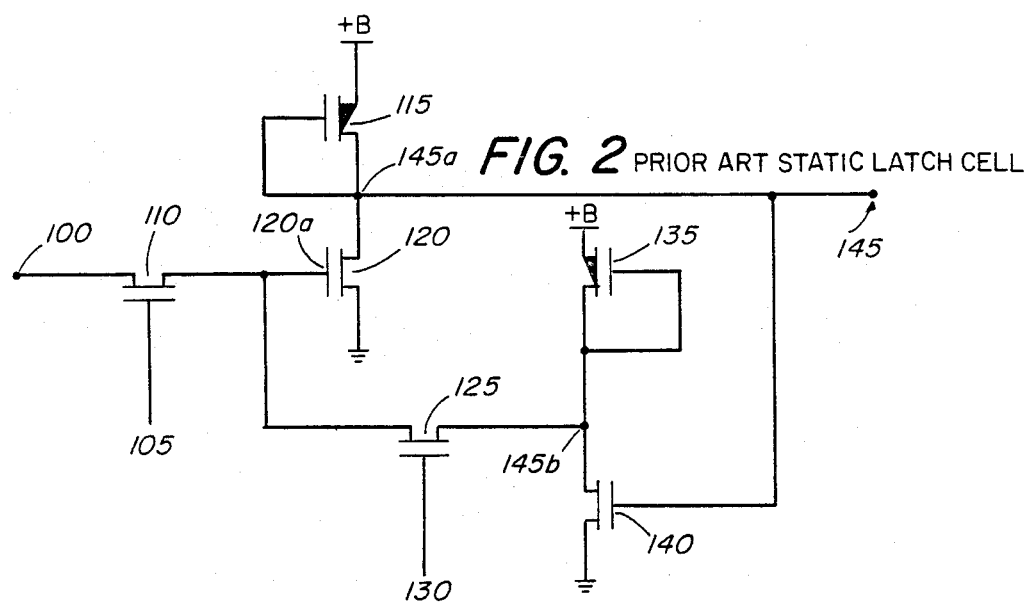
FIG. 2 PRIOR ART STATIC LATCH CELL
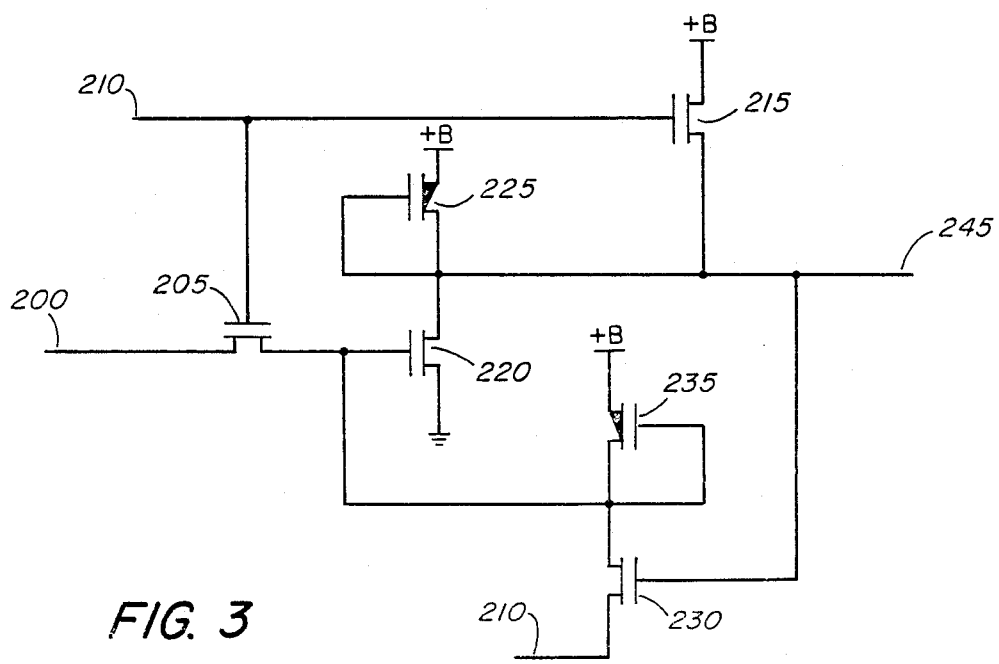
FIG. 3

NMOS DATA STORAGE CELL FOR CLOCKED SHIFT REGISTER APPLICATIONS

BACKGROUND OF THE INVENTION

This invention relates generally to a method and apparatus for computer memory and more specifically to shift registers using n-channel metal-oxide semiconductor (NMOS) technology.

Computers and computer systems require large memory storage capacity, as well as high speed movement of data in the form of binary digits in their operation. A shift register is a component which can shift data in the storage cells (typically, one cell can store one binary digit) sequentially from one group of addresses (locations) to another.

NMOS shift registers use n-channel MOS field effect transistors to control the movement of data. One approach in prior art storage cells is to connect two metal-oxide semiconductor field-effect transistors (MOSFETs) to form an inverter. Two inverters are connected in series with input and output (pass) transistors, to control the input and output of data. Once the data is introduced, the back to back pair of inverters retains the signal (alternating in value between a binary 1 and a binary 0 as it passes through each inverter) indefinitely until the output gates transfer the existing signal. The input and output pass transistors are controlled by signals from one clock line.

Another approach is to arrange the components similarly to the above, but add a disabling pass transistor between the pair of inverters. The disabling transistor is connected to a line having the complement of the clock line.

Some problems are encountered when these approaches are used, inter alia, the former approach has inferior speed qualities, while the latter approach has a lower density than desired. The lower density is generally produced because the size of the transistors comprising the inverters must be increased to obtain added speed. In addition to density decreases due larger transistors, the latter approach generally has one more input line then is desired.

Increases in speed, which generally lead to decreases in density, ultimately lead to increases in power consumption.

SUMMARY

Accordingly, it is a principal object of this invention to devise a NMOS data storage cell for use in clocked shift registers in such a manner that the overall speed of operation is increased.

Another principal object of this invention is to devise a NMOS data storage cell for use in clocked shift registers such that overall density is increased.

A further object of this invention is to decrease overall power consumption of NMOS data storage cells used in clocked shift register applications.

Yet another object of this invention is to combine all of the foregoing objects in a single apparatus and method.

The foregoing and other objects of the present invention are realized by adding a pre-charging transistor at the output of a prior art static cell, and connecting it to the input clock signal. The series combination of an inverter and a series pass transistor is replaced by an enabling inverter, which is connected to, and controlled by, the clock signal. The line transporting the complement of the clock signal is eliminated.

DESCRIPTION OF THE DRAWINGS

The foregoing and other objects and features of the present invention are apparent from the specification, the drawings and the two taken together. The drawings are:

FIG. 1 is a schematic diagram of a prior art Random Access Memory (RAM) type storage cell which could be used in clocked shift registers.

FIG. 2 is a schematic diagram of a prior art storage cell consisting of a static latch, also used in clocked shift registers.

FIG. 3 is a schematic diagram of the present invention.

THE DESCRIPTION

FIG. 1 shows a typical NMOS RAM storage cell. However, it is not an efficient configuration for storage cells used in unidirectional transfer of data, such as for use in a shift register.

FIG. 2 shows a more efficient configuration for a NMOS storage cell for use in a shift register. Data is entered at input 100. Clock line 105 controls the input gate (a MOSFET pass transistor), 110.. The input signal is passed through gate 110 and then through an inverter comprised of transistors 115 and 120. Transistor 115 is a "pull-up" transistor; it tends to pull the output of gates 115 and 120 toward the high voltage level(+B) when gate 120 is not conducting, essentially functioning as a resistor.

Gate 120 is a "pull-down" transistor; it tends to drive the output voltage 145 of the inverter toward the low voltage level, e.g. ground, when it is conducting. When a high voltage level input is applied to the gate 120a of transistor 120, it conducts, thereby causing the output 145 of the inverter to be at the low voltage level (usually about 0 volts). When a low voltage level input 100 is applied to transistor 120, it is disabled, leaving transistor 115 to affect the output voltage, which results in a high voltage level at output 145 (usually about 5 volts).

The input signal 100 is inverted by the transistor pair 120 and 115. The inverted signal is fed back to the gate 120a of transistor 120, i.e. back to the input of the first inverter through another inverter comprised of transistors 135 and 140, which act identically as the transistor pair 115 and 120. However, the signal 145 does not pass from the output of this second inverter unless pass transistor 125 is enabled. Pass transistor 125 is enabled or disabled by a signal 130, which is the complement of the clock signal 105. Therefore, the input signal 100 is stored in the cell of FIG. 2 at the output 145b of the second inverter, i.e. at the drain of the transistor 140. The complement of the input signal 100 is stored at the output 145a of the first inverter.

The present invention is an improvement over the storage cells diagramed in FIGS. 1 and 2, and is graphically illustrated in FIG. 3. It will thus be described in more detail than the prior-mentioned storage cells. All transistors discussed are of the N-MOSFET type.

Turning to FIG. 3, data is entered into the storage cell at data input terminal 200, in the form of logic high level and logic low level voltages, and only one voltage level can be stored in the cell at a given time. As in FIG. 2, the data is stored at the input of a first inverter made from the transistor pair 220 and 225. The input of the data is controlled by pass transistor 205, which is enabled and disabled by clock 210. The logic levels are typically 5 volts or 0 volts, each level, representing one binary digit (bit) of data.

It is characteristic of enhancement mode MOSFETs, such as pass transistor 205 that current flows between the drain and the source when the voltage between the gate and the source is greater than some small positive threshold level—typically 1 volt. By applying a logic high level pulse (typically 5 volts) to the gate of pass transistor 205 from clock 210, an input signal from input terminal 200 can be passed. Pass transistor 205 remains on as long as the input at its gate from clock 210 is at the logic high level.

Pre-charge transistor 215 tends to rapidly drive or maintain the output voltage at output 245 at the logic high level (+B). Transistor 215 is enabled or activated when clock 210 sends a logic high level to its gate, thus causing current to flow from its drain to its source. The drain of pre-charge transistor 215 is connected to +B, a 5 volt power supply, so that a 5 volt signal is passed by transistor 215 when it is enabled.

The entered data goes to the gate of transistor 220, which is enabled if the entered data is at the logic high level. Transistor 220, when conducting, pulls the output of transistors 220 and 225 to the logic low level when it is enabled, thus making it a "pull-down" transistor.

Transistor 225 serves as a "pull-up" transistor, or more correctly, a "pull-up resistor": it serves to hold the voltage at output 245 at the logic high level when transistor 220 is not conducting. It is a depletion mode type MOSFET, so that it is enabled when the voltage between its source and its gate is greater than some small negative threshold level (e.g., −1 volts). Since the gate and source are tied together, transistor 225 is always enabled, and effectively, the transistor functions as a resistor. The drain of transistor 225 is connected to a 5 volt (+B) power supply, so that a 5 volt signal is at output 245 when transistor 220 is disabled, and a zero or near zero volt level is at output 245 when transistor 220 is enabled.

The current flow through MOSFETs is directly proportional to the channel width divided by the channel length. Compared to transistors 225 and 215, this ratio for transistor 220 is greater, thus causing transistor 220 to switch the voltage at output 245 to the logic low level when transistor 220 is enabled.

When transistor 220 is disabled, the voltage at output 245 rapidly goes from the zero level to the logic high level (+B), with the aid of pre-charge transistor 215, which causes +B volts to appear at the output 245 shortly after transistor 215 is enabled by clock input 210. If transistor 215 is not present in the circuit, the rise time for +B to appear at output 245 primarily depends on the size of pull-up transistor 225, and is thus longer because of size restrictions due to power consumption. The rise time is the time necessary for the output voltage 245 to rise to +B volts from approximately 0 volts after transistor 220 is disabled. In other words, transistor 215 dramatically decreases the rise time to +B when transistor 220 is disabled.

Summarizing the operation of transistors 215, 220 and 225, a low logic level input signal at the gate of transistor 220 is converted to the logic high level at output 245, while a high logic level input is converted to a low logic level signal at output 245. Pre-charge transistor 215 decreases the time necessary to convert a logic low level input signal at transistor 220 to a logic high level signal at output 245. The time required to invert a logic high level input is approximately the same as for the circuit of FIG. 2. Thus, the result of passing data through transistors 220 and 225 is to invert it at a higher speed than in prior art data storage cells, such as diagramed in FIG. 2.

At the same time that clock 210 activates pass transistor 205, it inactivates pass transistor 230, which is part of a second inverter comprised of pull-down transistor 230 and pull-up transistor 235. The second inverter acts almost identically as the first inverter comprised of transistors 220 and 225. However, the transistor pair 230 and 235 act as an inverter only when the clock input 210 is at a logic low level. During the clock time, the gate to source bias of transistor 230 is incorrect for the transistor pair to operate as an inverter. Clock input 210 is connected to the source of transistor 230, resulting in disablement whenever the input from clock 210 is at a logic high level. The threshold voltage for transistor 230 is never reached during this cycle of the clock, since the voltage at the gate of transistor 230 can at best equal the logic high level. In the preferred embodiment transistor 230 has a high impedance (the ratio of the channel width to the channel length is small) to isolate the gate of transistor 220 from the clock line 210, such that loading effects are minimized when multiple storage cells are driven in parallel from a common clock driver, as in a register array.

Between the high levels of the clock 210, transistors 230 and 235 act as an inverter, inverting the signal from output node 245. The input to the gate transistor 220 between clock pulses is held at the level of the initial input at transistor gate 220. Therefore, the data is "latched" into the storage cell at the gate of transistor 220 until new data of a different logic level is entered.

Only one clock input line, rather than a clock line and a clock complement line taught by the prior art, needs to be routed through each cell, thus permitting a higher packing density for the present storage cell because an inverter transistor pair is not needed to generate the clock complement. Pre-charge transistor 215 may be very small and still serve its speed increasing function, so that no appreciable density penalty results. The prior art teaches increasing the size of the transistors serving the inverting functions of 220, 225, 230 and 235 of the storage cell to increase the operating speed, resulting in a noticeable density penalty. The present invention can achieve higher speeds without the use of larger transistors, thus resulting in a higher packing density for the storage cell.

Another advantage of the present invention is a lower power consumption than typical prior art NMOS storage cells, such as shown in FIG. 2. Since pull-up transistors 225 and 235 function only to retain a logic high level voltage under static conditions, the ratio of channel width to channel length for these transistors is very small, and power consumption is minimized. Additionally, because transistors 220 and 215 are both enhancement type MOSFETs, changes due to process parameter (or manufacturing) variations will not affect transistor drive ratios and, hence, output voltage characteristics.

Modifications and variations of the foregoing will occur to those skilled in the art, and as such, are encompassed within the scope of this invention. For example, the pre-charge transistor 215 of FIG. 3 may be coupled to the output 145 of the cell in FIG. 2 in the same fashion as in FIG. 3. Also, the second inverter comprised of transistors 230 and 235 of FIG. 3 can be substituted for the second inverter comprised of transistors 135 and 140, and pass transistor 125 in FIG. 2.

We claim:

1. A NMOS data storage cell comprising:

clocking means input for inputting a single timing signal;

data input means for inputting data to said data storage cell;

a pre-charge transistor connected at its gate to said clocking means input, for pre-charging the output of said storage cell to the logic high level voltage when said timing signal is a logic high level voltage;

a first pass transistor connected to said clocking means input, to allow the input of data from said data input means when said clocking means input signal is at a logic high level and to prevent the input of data when said clocking means input signal is at a logic low level;

a first inverter connected to said first pass transistor and to the output of said data storage cell, for inverting input data received at the input of said inverter from said first pass transistor; and a second inverter connected at its input to the output of said data storage cell and at its output to the input of said first inverter, for inverting data received at its input from the output of said data storage cell.

2. A NMOS data storage cell comprising:

clocking means input for inputting a single timing signal;

data input means for inputting data to said data storage cell;

a first pass transistor connected to said clocking means input, to allow the input of data from said data input means when said clocking means input signal is at a logic high level and to prevent the input of data when said clocking means input signal is at a logic low level;

a first inverter connected to said first pass transistor and to the output of said data storage cell, for inverting input data received at the input of said inverter from said first pass transistor; and a second inverter connected at its input to the output of said data storage cell and at its output to the input of said first inverter, for inverting data received at its input from the output of said data storage cell, said second inverter including a transistor pair having the source of one of the pair connected to said clocking means input signal, so that said second inverter is enabled to pass data when said clocking means input signal is at a logic low level, and is disabled to prevent the passage of data when said clock input signal is at a logic high level.

3. A NMOS data storage cell comprising:

clocking means input for inputting a single timing signal;

data input means for inputting data to said data storage cell;

a pre-charge transistor connected at its gate to said clocking means input, for pre-charging the output of said storage cell to the logic high level voltage when said timing signal is a logic high level voltage;

a first pass transistor connected to said clocking means input, to allow the input of data from said data input means when said clocking means input signal is at a logic high level and to prevent the input of data when said clocking means input signal is at a logic low level;

a first inverter connected to said first pass transistor and to the output of said data storage cell, for inverting input data received at the input of said inverter from said first pass transistor; and a second inverter connected at its input to the output of said data storage cell and at its output to the input of said first inverter, for inverting data received at its input from the output of said data storage cell, said second inverter including a transistor pair having the source of one of its transistors connected to said clock input signal, so that said second inverter is enabled to pass data when said clock input signal is at a logic low level, and is disabled to prevent the passage of data when said clock input signal is at a logic high level.

4. A shift register for unidirectional propagation of data comprising a plurality of the NMOS data storage cell in claim 1.

5. A shift register for unidirectional propagation of data comprising a plurality of the NMOS data storage cell in claim 2.

6. A shift register for unidirectional propagation of data comprising a plurality of the NMOS data storage cell in claim 3.

7. A method of storing binary data in a NMOS data storage cell comprising:

inputting a single clocked timing signal;

inputting data to be stored;

pre-charging the output of said storage cell to the logic high level voltage when said clocked timing signal is at a logic high level voltage, using a pre-charge transistor having its gate coupled to the clocked timing signal;

enabling a first pass transistor with said clocked timing signal, to allow the input of data when said clocked timing signal is at a logic high level;

disabling said first pass transistor with said clocked timing signal, to prevent the input of data when said clocked timing signal is at a logic low level voltage;

inverting the data inputted through said first pass transistor with a first inverter;

inverting the output of said first inverter by a second inverter;

coupling the output of said second inverter to the input of a second pass transistor having its gate coupled to the complement of said clocked timing signal;

enabling said second pass transistor to allow the passage of data from said second inverter to said first inverter when said clocked timing signal is at a logic low level; and disabling said second pass transistor to prevent the passage of data from said second inverter to said first inverter when said clocked timing signal is at a logic high level.

8. A method of storing binary data in a NMOS data storage cell comprising:

inputting a single clocked timing signal;

inputting data to be stored;

enabling a first pass transistor with said clocked timing signal, to allow the input of data when said clocked timing signal is at a logic high level;

disabling said first pass transistor with said clocked timing signal, to prevent the input of data when said clocked timing signal is at a logic low level voltage;

inverting the data inputted through said first pass transistor with a first inverter; and coupling a second inverter at its input to the output of said data storage cell and at its output to the input of said first inverter, said second inverter including a transistor pair having the source of one of the pair connected to said clocked timing signal thereby enabling said second inverter to invert data received from the output of said first inverter, and passing said inverted data, when said clocked timing signal is at a logic low level, and disabling said second inverter to prevent data received from the output of said first inverter from being inverted and passed by said second inverter, when said clocked timing signal is at a logic high level.

9. A method of storing binary data in a NMOS data storage cell comprising:

inputting a single clocked timing signal;

inputting data to be stored;

pre-charging the output of said storage cell to the logic high level voltage when said clocked timing signal is at a logic high level voltage, using a pre-charge transistor having its gate coupled to the clocked timing signal;

enabling a first pass transistor with said clocked timing signal, to allow the input of data when said clocked timing signal is at a logic high level;

disabling said first pass transistor with said clocked timing signal, to prevent the input of data when said clocked timing signal is at a logic low level voltage;

inverting the data inputted through said first pass transistor with a first inverter; and coupling a second inverter at its input to the output of said data storage cell and at its output to the input of said first inverter, said second inverter including a transistor pair having the source of one of the pair connected to said clocked timing signal, thereby enabling said second inverter to invert data received from the output of said first inverter, and passing said inverted data, when said clocked timing signal is at a logic low level, and disabling said second inverter to prevent data received from the output of said first inverter from being inverted and passed by said second inverter, when said clocked timing signal is at a logic high level.

10. The NMOS data storage cell of claim 1 wherein the output of said second inverter is connected to the input of said first inverter by means of a second pass transistor that is arranged to allow the passage of data from said second inverter to said first inverter when said clocking means input signal is at a logic low level, and to prevent the passage of data from said second inverter to said first inverter when said clocking means input signal is at a logic high level.

* * * * *